United States Patent [19]

Yug

[11] Patent Number: 4,837,621
[45] Date of Patent: Jun. 6, 1989

[54] MODE DISCRIMINATOR FOR MONITOR

[75] Inventor: Geun J. Yug, Kyungsangbook-do, Rep. of Korea

[73] Assignee: Goldstar Co., Ltd., Seoul, Rep. of Korea

[21] Appl. No.: 139,819

[22] Filed: Dec. 30, 1987

[30] Foreign Application Priority Data

Dec. 30, 1986 [KR] Rep. of Korea ............... 21755/1986

[51] Int. Cl.$^4$ .............................................. H04N 5/04
[52] U.S. Cl. .................................... 358/148; 358/149; 358/150; 358/153
[58] Field of Search ............... 358/148, 149, 150, 153, 358/154, 158, 159

[56] References Cited

U.S. PATENT DOCUMENTS 4,608,602 8/1986 Grantham-Hill .................... 358/154
4,729,023 3/1988 Srivastava et al. ................. 358/148

Primary Examiner—James J. Groody
Assistant Examiner—Michael D. Parker
Attorney, Agent, or Firm—Birch, Stewart, Kolasch & Birch

[57] ABSTRACT

A mode discriminator for detecting a specific mode of horizontal synchronizing frequency applied to a display monitor includes first and second monostable multivibrators coupled to a vertical synchronizing signal associated with the horizontal synchronizing frequency. The discriminator detects the polarity of the vertical synchronizing signal to detemine whether the horizontal synchronizing frequency is of a first mode or a second mode in which the frequencies are different. Since the discriminator detects the polarity of vertical synchronizing signals and does not depend on the time difference between pulse widths of a horizontal synchronizing signal, reliability and performance are enhanced.

4 Claims, 2 Drawing Sheets

MODE DISCRIMINATOR FOR MONITOR

BACKGROUND OF THE INVENTION

The present invention relates to a horizontal sync signal mode discriminator for display monitors, in particular, a mode discriminator which can discriminate a particular horizontal sync frequency mode by means of the polarity of vertical synchronizing signals.

According to the conventional art shown in FIG. 3 (A), the horizontal synchronizing signal is applied through a first-stage stable multivibrator 31 to a second stable multivibrator 32, whose outputs are used for maintaining horizontal sync voltage, for stabilizing vertical synchronization and for controlling a double mode switch.

According to the conventional art employing a waveform in FIG. 3 (B), upon applying horizontal sync frequency of mode 1 the first stage stable multivibrator 31 detects the rising edge of the input signals of period TW1 and delays a change in output for a preset time TW3 as shown in FIG. 3 (C). The output waveform is as in FIG. 3 (C).

The second stage stable multivibrator 32 detects the rising edge of the waveform shown in FIG. 3 (C) to delay a change in output for a time TW4 as shown in FIG. 3 (B). However, since the time TW3 is smaller than TW4, the output waveform of the second stage stable multivibrator 32 remains at a high level voltage as shown in the left side of FIG. 3 (D) and is supplied to the horizontal hold switch circuit and the stabilizing vertical synchronization circuit to cause a desired operation, and is also supplied to the double mode switch so as to compensate for the effects of horizontal frequency variations. Upon applying a horizontal sync frequency of mode 2, multivibrator 31 detects the rising edge of signals of period TW2 which is smaller than delay time TW3. Therefore, the output of multivibrator 31 remains high as shown in the right side of FIG. 3 (C). As such, the output of multivibrator 32 remains low as shown for mode 2 in FIG. 3 (D). However, in practice, the error of capacitors C1 and C2 and the difference of pulse width between times TW1 and TW2 are too small for the main correction resistor VR1 to compensate for, thus resulting in the disadvantage of lowering the productivity and reliability of the product.

BRIEF SUMMARY OF THE INVENTION

The present invention is designed to eliminate the disadvantage of the conventional art and enables the discrimination of horizontal modes by means of the polarity of vertical synchronizing signals to enlarge the difference between pulse widths to facilitate the adjustment of time constants and enhance productivity and reliability for the discriminator.

DETAILED DESCRIPTION OF THE INVENTION

Figure 1:
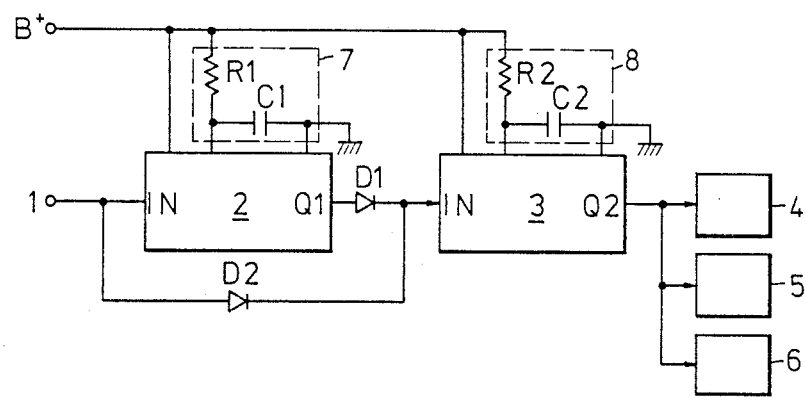
FIG. 1 shows a circuit of the device embodying the invention.

Referring to the drawings, the construction and operation of the present invention shall be described in the following:

Referring to the device of FIG. 1, input terminal 1 of a vertical synchronizing frequency signal is connected to input IN of the first stage monostable multivibrator 2 and also to the input IN of the second stage monostable multivibrator 3 through diode D2, and output Q1 of the multivibrator 2 is connected via diode D1 to the second stage monostable multivibrator 3, whose output is coupled to a horizontal hold switch circuit 4, a vertical synchronization stabilizing circuit 5 and a double mode switch 6. The first and second monostable multivibrators 2 and 3 are connected with voltage source B+ via RC time constant circuits 7 and 8.

Figure 2:
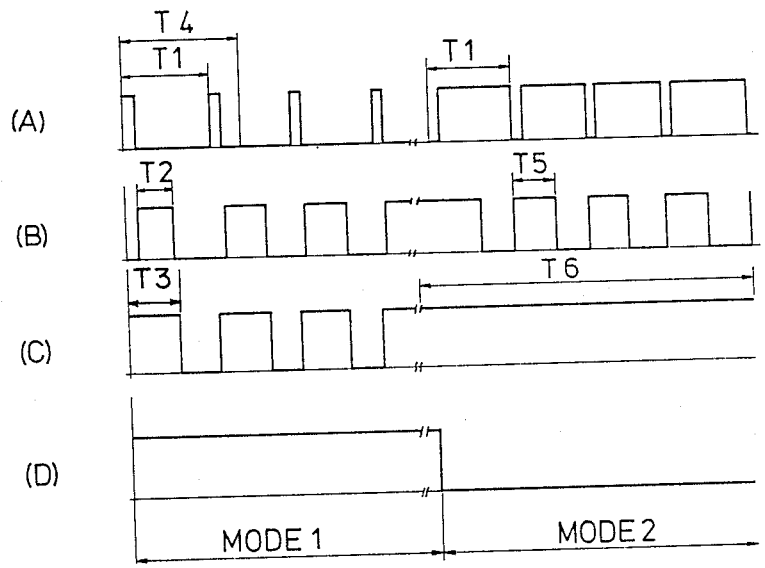
FIGS. 2 (A) to (D) inclusive illustrate waveforms at respective sections of the device.
Figure 3:
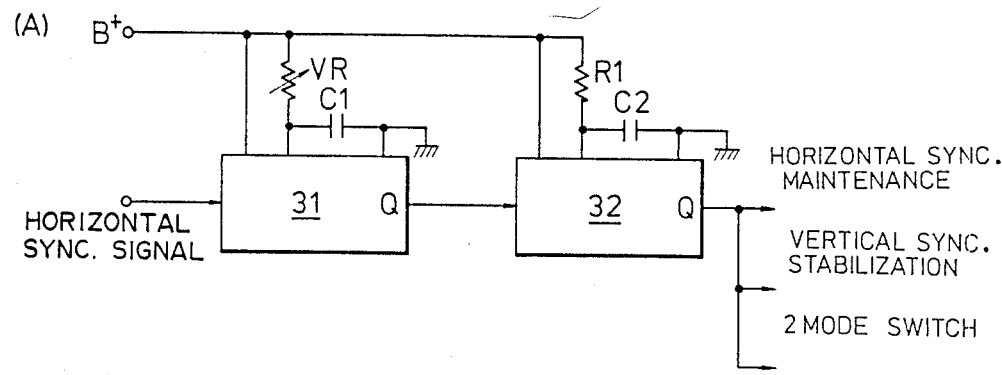
FIGS. 3 (A) to (D) inclusive illustrate a conventional mode discriminator.
Figure 3:
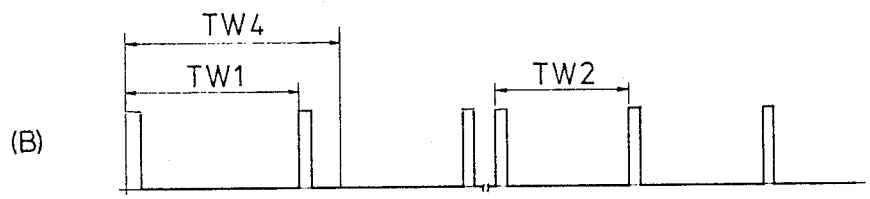
Figure 3:
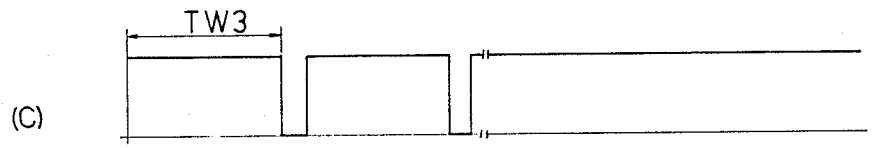
Figure 3:
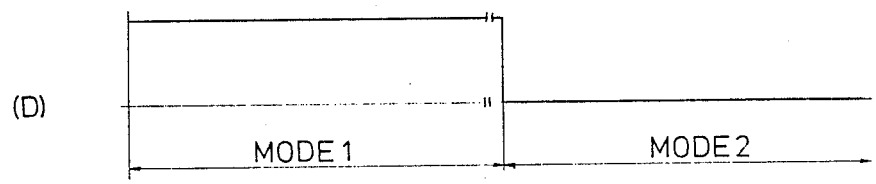

The operation of the device shall be described as follows. Referring to FIGS. 2 (A) to (D) inclusive, upon applying a positive polarity vertical synchronizing frequency of a first mode, the first stage monostable multivibrator 2 detects the falling edge of input signals shown in FIG. 2 (A) to change output state for a time T2 as shown in the waveform of FIG. 2 (B).

However, since diodes D1 and D2 are connected like an OR gate, input IN of the second stage monostable multivibrator 3 is applied with a waveform having a cycle T3 in FIG. 2 (C) which is a combined form of the waveforms in FIG. 2 (A) and (B). As a result, the multivibrator 3 detects a rising edge of the waveform in FIG. 2 (C) to delay a change in output for a time T4. Since the time T3 is smaller than the time T4 for which the output Q2 of the second stage stable multivibrator is at a high level, the waveform in FIG. 2 (D) is applied to the control terminal of the horizontal hold circuit 4, the horizontal synchronization stable circuit 5 and the mode switch 6 to correct and adjust horizontal hold and vertical size of the reproduction display screen affected by horizontal frequency change.

Meanwhile, when a negative polarity vertical synchronizing signal of time T1, i.e. mode 2 signal is supplied to the input IN of the multivibrator 2, the falling edge of the waveform in FIG. 2 (A) is detected to provide a high level output for a time T5 as shown in the waveform of FIG. 2 (B) at the output Q1. However, the signal is also supplied in the waveform, T6, in FIG. 2 (C) through diodes D1, D2 constituting an OR circuit to the input IN of the multivibrator 3. As such, the waveform of FIG. 2 (C) continuously maintains a "high" level such that the waveform input to the multivibrator 3 does not have a rising edge and thereby the output Q2 of the multivibrator 3 remains at a "low" level as in FIG. 2 (C).

This invention relates to a mode conversion signal unit that uses vertical synchronizing frequency signals having broad pulse width and therefore does not detect pulse width but detects the polarity of vertical synchronizing frequency signals.

I claim:

1. A mode discriminator for discriminating a horizontal synchronizing frequency mode applied to a display monitor, comprising:
a first monostable multivibrator having an input coupled to a vertical synchronizing signal of a polarity corresponding to a particular horizontal synchronizing frequency;

a second monostable multivibrator having an input coupled to said vertical synchronizing signal and to an output of said first monostable multivibrator;

said first monostable multivibrator being responsive to a falling edge of said vertical synchronizing signal to output a signal of a first predetermined period;

said second monostable multivibrator being responsive to a rising edge of either of said vertical synchronizing signal or said signal output by said first monostable multivibrator to output a signal of a second predetermined period;

said vertical synchronizing signal and said signal output by said first monostable vibrator combining at the input of said second monostable multivibrator such that a rising edge is detected for a first horizontal synchronizing frequency mode, and no rising edge is detected for a second horizontal synchronizing frequency mode.

2. The mode discriminator of claim 1, wherein said vertical synchronizing signal and said signal output by said first monostable multivibrator are coupled to said second monostable multivibrator via a pair of diodes.

3. The mode discriminator of claim 1, wherein said signal output by said second monstable multivibrator is coupled to a horizontal hold circuit, a vertical stabilization circuit, and a double mode switch of said display monitor.

4. The mode discriminator of claim 1, wherein said first and second monostable multivibrators are coupled to a voltage source via first and second time constant circuits.

* * * * *